United States Patent [19]
Rosolen et al.

[11] Patent Number: 5,879,860
[45] Date of Patent: Mar. 9, 1999

[54] METHOD OF WRITING A PATTERN BY AN ELECTRON BEAM

[75] Inventors: Grahame Craig Rosolen, Northmead, Australia; Peter Gerald Mitchell, Cambridgeshire, Great Britain

[73] Assignee: Leica Microsystems Lithography Limited, Cambridge, England

[21] Appl. No.: 652,546

[22] PCT Filed: Dec. 8, 1993

[86] PCT No.: PCT/EP93/03454

§ 371 Date: Jun. 7, 1996

§ 102(e) Date: Jun. 7, 1996

[87] PCT Pub. No.: WO95/16274

PCT Pub. Date: Jun. 15, 1995

[51] Int. Cl.[6] .............................. G03C 5/00; A61N 5/00
[52] U.S. Cl. .................. 430/296; 430/942; 250/492.3
[58] Field of Search ................................ 430/296, 942; 250/396 R, 492.3

[56] References Cited

U.S. PATENT DOCUMENTS 4,586,141   4/1986   Yasuda et al. ........................... 364/490

FOREIGN PATENT DOCUMENTS 2218115   8/1990   Japan .

OTHER PUBLICATIONS

Proceedings of SPIE, vol. 923, Bellingham (USA) pp. 246–252, M. Ohyama et al. "High speed data control circuit for nanometric electron beam lithography".

English translation of JP 218115.

Shearer et al., Development of nanometric electron beam lithography system (JBX–5D II), J. Vac. Sci. Technol.B., 4(1), Jan./Feb., 1986, pp. 64–67.

*Primary Examiner*—Janet Baxter
*Assistant Examiner*—Rosemary Ashton
*Attorney, Agent, or Firm*—Foley & Lardner

[57] ABSTRACT

A method of writing a pattern on a substrate by a deflectable electron beam, in particular a pattern containing very fine features such as nanostructures, is carried out by dividing the pattern into at least two fields of differing size (15, 17) which are arranged one inside the other and have a common center (18) arranged at the central axis of the beam at which the beam has an undeflected setting, with the finer or finest pattern features contained in the inner field (15). The pattern is written by keeping the substrate stationary and writing the two fields in succession with a change in writing resolution of the beam on transition from one field to the next such that a finer step size is used for an inner field than for an outer field.

12 Claims, 1 Drawing Sheet

METHOD OF WRITING A PATTERN BY AN ELECTRON BEAM

BACKGROUND

The invention relates to a method of writing a pattern on a substrate by means of an electron beam.

It is common practice in electron beam lithography to write patterns on wafers, masks, reticles and other substrates by fracturing the patterns, i.e. breaking down each pattern into sub-patterns and by exposing the sub-patterns in sequence to build up a composite image. The pattern is conventionally divided into a grid format of square main fields and each main field is further divided into a grid format of square sub-fields. Each subfield is written by beam deflection to scan the subfield area, usually by vectoring of the beam to individual pattern shapes within the area by the most economic sequence of travel and by boustrophedon scanning of each shape. At the conclusion of each sub-field scanning the beam is moved on to the next sub-field and the process is repeated. When the pattern features of all sub-fields have been written, the substrate itself is displaced to position a succeeding main field centrally of the beam axis, so that its sub-fields can in turn be written.

The main field sizes in such fractured patterns are typically in the order of 0.1 to 4.0 millimeters square and in excess of 1,000 sub-fields are generally present on each field. The sub-field size principally depends on the fineness of the pattern features; features with a 1.0 micron dimension may be written by, for example, a resolution represented by 0.1 micron steps in the beam deflection, resulting in a sub-field size of about 100 microns square. To minimize or avoid distortion of pattern features which cross sub-field and main field boundaries or misalignment of features interconnected at these boundaries, it is necessary to apply corrections to the beam deflection system on each transition between sub-fields and main fields. These corrections compensate for, for example, deflection distortion, magnetic effects and time-related drift effects.

The afore-described lithographic techniques are in general use in the industry and are summarised in, for example, Jones and Dix: Electron Beam Lithography in Telecommunications Device Fabrication, Part 1, British Telecom Technology Journal, Vol. 7, No. 1.

Whilst such techniques are successful in microlithography, difficulties arise if they are applied to nanolithography. Nanolithography patterns are typically characterised by extremely fine features grouped centrally and coarser features graduating out towards the edges of the pattern. Writing the pattern requires the sub-fields to be only a few microns square, which results in correspondingly small main fields and sub-fields. This in turn significantly increases scanning time for the entire pattern. In addition, alignment of features at sub-field and main field boundaries is more difficult, particularly at transitions of pattern fineness.

SUMMARY OF INVENTION

It is therefore the object of the present invention to provide a method of electron beam lithography which is suitable for writing patterns with a total size and a fineness graduation and distribution of the kind encountered in nanolithography and which allows required standards of acuity to be maintained without extending throughput time.

Other objects and advantages of the invention are apparent from the following description.

According to the invention there is provided a method of writing a pattern on a substrate by means of an electron beam, wherein the pattern has features of differing degrees of fineness and is divided into a plurality of fields which are written in succession by controlled deflection of the beam relative to a neutral axis thereof, characterised in that the pattern is divided into at least two fields of differing size arranged one inside the other with a common centre point at the neutral axis and with the finer or finest of the pattern features contained in the inner field and that the at least two fields are written in succession by maintaining the substrate in a fixed location and so changing the writing resolution of the beam on transition from one field to the next such that a finer resolution is used for the inner field than for the outer field.

Through fracturing of the pattern into at least two concentric fields of different size with the inner or smaller field containing the features of finest detail, the fields can be written in succession by changing the writing resolution between the fields. Reducing the writing resolution enables a larger beam deflection area, so that the outer or larger field with coarser detail can be written with a comparatively large field size and consequently without compromising writing speed. The increase in beam deflection area achieved by reduced resolution avoids the need to displace the substrate and the stationary centre point of the fields coincides with the beam neutral axis, thus facilitating corrections between fields.

The beam is preferably controlled to write the pattern features of the inner field before those of the outer field, so that the scanning procedure is one of relaxation rather than contraction of the resolution. This simplifies alignment of features at the field boundaries.

The fields themselves are preferably square, although oblong, rectangular or round shapes are possible, and for preference are positioned to overlap at the boundaries. Overlapping assists interconnection of continuing features at field transitions.

The change in the writing resolution can be achieved in a simple manner by varying a step size of the beam deflection, such as through changing the acceleration voltage of the beam, preferably in dependence on the width ratio of the two fields. Change in the acceleration voltage causes change in the susceptibility of the beam to deflection and thus in the deflection step size for a given deflection force. Additionally or alternatively, the step size can be varied by changing the drive force of a deflection drive for the beam, again preferably in dependence on the mentioned field width ratio.

The change in writing resolution can also be achieved, in conjunction with or independently of variation in the deflection step size, by varying the spot size of the beam.

BRIEF DESCRIPTION OF THE DRAWING

An example of the invention will now be more particularly described by reference to the accompanying drawing, the single FIGURE of which illustrates an arbitrary nanolithography pattern fractured to permit writing by a method exemplifying the invention.

DETAILED DESCRIPTION OF PREFERRED EMBODIMENTS

Figure 1:
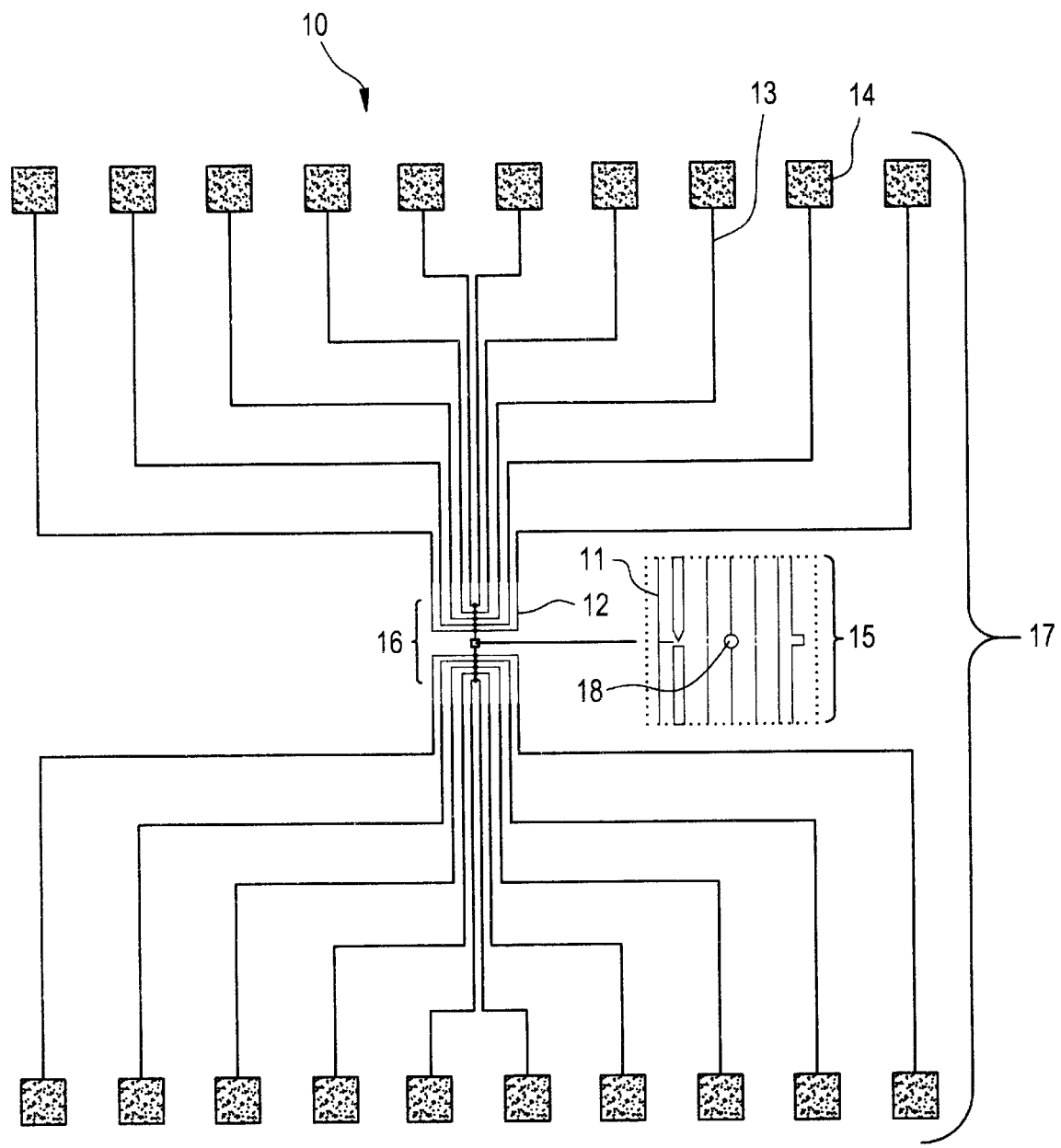

The pattern 10 depicted in the drawing has a small central zone containing circuit nanostructures 11, which are indicated schematically in the detail view in the drawing, a larger intermediate zone containing fine interconnect lines 12 and a still larger outer zone containing further lines 13 and pads 14 which are relatively coarse and which make it possible to connect the nanostructures to outlying components in a circuit. The pattern is fractured into three square fields 15, 16 and 17 respectively corresponding to the three zones and having a common centre 18. The field width dimensions can be, for example, 10 microns for the centre field 15, 100 microns for the intermediate field 16 and 1 millimeter for the outer field 17.

The pattern is written on a substrate by a suitable electron beam lithography machine generating a focussed electron beam which is deflectable by way of deflection coils digitally controlled by software responsive to the input of pattern data. Such machines are well-known, cf. Jones and Dix op. cit., and a more detailed description is not necessary. The substrate, for example a wafer or mask plate, is loaded into a holder which is placed on a movable writing stage of the machine and precisely positioned in a predetermined location by registration with respect to a substrate mark scanned by the beam prior to the start of writing. The substrate is maintained in the predetermined location during writing. Writing is initiated by vectored deflection of the beam in steps, in accordance with the shape of the nanostructures 11 present in the centre field 15, with a grid step size of, for example, 10 nanometers. The features present in the centre field are written in such a manner that the field centre 18 coincides with the beam axis in the neutral, or central, i.e. undeflected, setting of the beam; thus the centre of the entire pattern lies on that axis. The pattern 10 itself, however, can be in any specified position on the substrate.

At the conclusion of writing the centre field 15, the beam is blanked and deflected to a starting position for writing the pattern features 12 present in the intermediate field 16, with the beam writing resolution then relaxed to a deflection step size of, for example, 100 nanometers. The pattern features 12 are then written by beam scanning of the intermediate field 16, for example on a track around the centre field 15, with a slight overlap of the centre field at the common boundary so as to ensure feature interconnection at the boundary. The amount of overlap can be equivalent to the difference in resolution for the two fields. After the intermediate field pattern features have been written, the beam is again blanked and deflected to a starting postion for writing the features 13, 14 in the outer field 17. Once again the resolution is relaxed, for example to a 1 micron step size, and the outer field 17 is then scanned with the new resolution to write the relatively coarse outer field features.

The three fields are thus written without displacement of the substrate and with use of a fixed datum, namely the common centre 18 of the fields located at the neutral axis of the beam. Although corrections can be made, in conventional manner, on transition between the fields and also between subfield insofar as any of the fields are fractured into subfields, the use of a common field datum significantly reduces the need to correct for feature alignment at the main field transitions. One method of achieving the change in the beam deflection sensitivity, for progressive relaxation of the writing resolution, is to reduce the acceleration voltage of the beam, whereby the resistance of the beam to deflection for a given force is correspondingly reduced. Other, more conventional methods can be employed, such as increasing the drive force of the beam deflection drive, in particular by increasing the energising current of the deflection coils. The factor for the change in sensitivity is dependent on the field width W, in particular $W_j/W_i$, and the change in acceleration voltage V is represented as the square root of $V_i/V_j$. A similar factor can be used for the change in drive force. Relaxation of the writing resolution is also possible, in conjunction with or independently of change in the beam deflection sensitivity, by increasing the beam spot size, for example through alteration or adjustment of the optical system provided in the beam column of the machine.

The scanning of the fields can be boustrophedon rather than vectored if appropriate to do so and one or more of the fields can be fractured into subfields, although the scanning areas achievable by the variation in the deflection step size are sufficient, in the case of the exemplified field dimensions, to avoid the need for finer fracturing of the pattern. This particularly contributes to the speed at which the individual fields can be written. In the case of nanolithographic pattern features the beam would usually have a Gaussian form, but a shaped form can be used if permitted by the features of the pattern concerned.

The fields are preferably square, so as to simplify digital control of the beam deflection in the X and Y axial directions, but other field shapes can be used if required by the pattern format.

We claim:

1. A method of writing a pattern on a substrate by means of an electron beam, wherein the pattern has features of differing degrees of fineness and is divided into a plurality of fields which are written in succession by controlled deflection of the beam relative to a central axis thereof at which the beam has an undeflected setting, wherein:

the pattern is divided into at least two fields of differing size arranged one inside the other with a common center point at the central axis and with a finest of the features contained in an inner field; and the at least two fields are written in succession while maintaining the substrate in a fixed location and changing a writing resolution of the beam on transition from one field to the next field such that a finer resolution is used for the inner field than for an outer field.

2. A method according to claim 1, wherein the beam is controlled so as to write the features of the inner field before those of the outer field.

3. A method according to claim 1, wherein each of the fields is rectangular.

4. A method according to claim 1, wherein the at least two fields overlap at boundaries thereof.

5. A method according to claim 1, wherein the writing resolution is changes by varying a step size of the beam deflection.

6. A method according to claim 5, wherein the step size is varied by changing the acceleration voltage of the beam.

7. A method according to claim 6, wherein the change in voltage is selected in dependence on the ratio of the widths of the at least two fields.

8. A method according to claim 5, wherein the step size is varied by changing the drive force of a deflection drive for the beam.

9. A method as claimed in claim 8, wherein the change in drive force is selected in dependence on the ratio of the widths of the at least two fields.

10. A method according to claim 1, wherein the writing resolution is changed by varying the spot size of the beam.

11. A method according to claim 1, wherein the finest features are nanostructures.

12. A method as claimed in claim 1, wherein each of the fields is written with vectored deflection of the beam continuously over the entire field.

* * * * *